United States Patent
Nagase et al.

(10) Patent No.: US 10,037,837 B2
(45) Date of Patent: Jul. 31, 2018

(54) RESISTOR AND METHOD FOR MANUFACTURING RESISTOR

(71) Applicant: MITSUBISHI MATERIALS CORPORATION, Tokyo (JP)

(72) Inventors: Toshiyuki Nagase, Gotemba (JP); Hiroya Ishizuka, Sunto-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/110,096

(22) PCT Filed: Jan. 7, 2015

(86) PCT No.: PCT/JP2015/050253
§ 371 (c)(1),
(2) Date: Jul. 6, 2016

(87) PCT Pub. No.: WO2015/105124
PCT Pub. Date: Jul. 16, 2015

(65) Prior Publication Data
US 2016/0336099 A1 Nov. 17, 2016

(30) Foreign Application Priority Data
Jan. 8, 2014 (JP) ................. 2014-001739

(51) Int. Cl.
*H01C 1/084* (2006.01)
*H01C 1/14* (2006.01)
(Continued)

(52) U.S. Cl.
CPC ............... *H01C 1/084* (2013.01); *H01C 1/01* (2013.01); *H01C 1/14* (2013.01); *H01C 1/142* (2013.01);
(Continued)

(58) Field of Classification Search
CPC ........ H01C 1/084; H01C 1/14; H01C 17/006; H01C 17/28; H01C 17/283; H01L 2224/40
(Continued)

(56) References Cited

U.S. PATENT DOCUMENTS 5,355,281 A 10/1994 Adelmann et al.
5,990,780 A * 11/1999 Caddock, Jr. ............ H01C 1/08
338/309
(Continued)

FOREIGN PATENT DOCUMENTS

CN 1198244 A 11/1998
EP 2259308 A1 12/2010
(Continued)

OTHER PUBLICATIONS

International Search Report dated Apr. 14, 2015, issued for PCT/JP2015/050253 and English translation thereof.
(Continued)

*Primary Examiner* — Kyung Lee
*Assistant Examiner* — Iman Malakooti
(74) *Attorney, Agent, or Firm* — Locke Lord LLP; James E. Armstrong, IV; Nicholas J. DiCeglie, Jr.

(57) ABSTRACT

In this resistor, a heat sink (Al member) (23) and the other surface (11*b*) of a ceramic substrate (11) are joined together using an Al—Si-based brazing filler material. The Al—Si-based brazing filler material has a melting point in a range of approximately 600° C. to 700° C. When the heat sink (23) and the ceramic substrate (11) are joined together using the Al—Si-based brazing filler material, it is possible to prevent the derogation of the heat resistance and thermal deterioration during joining at the same time.

11 Claims, 8 Drawing Sheets

(51) Int. Cl.
*H01C 17/00* (2006.01)
*H01C 17/28* (2006.01)
*H01C 1/142* (2006.01)
*H01C 1/144* (2006.01)
*H01C 1/01* (2006.01)

(52) U.S. Cl.
CPC ........... *H01C 1/144* (2013.01); *H01C 17/006* (2013.01); *H01C 17/28* (2013.01); *H01C 17/281* (2013.01); *H01C 17/283* (2013.01); *H01L 2224/40* (2013.01); *H01L 2924/181* (2013.01)

(58) Field of Classification Search
USPC .......................................................... 338/51
See application file for complete search history.

(56) References Cited

U.S. PATENT DOCUMENTS

| | | |
|---|---|---|
| 6,943,455 B1 | 9/2005 | Maxwell |
| 2002/0113302 A1 | 8/2002 | Shinohara |

FOREIGN PATENT DOCUMENTS

| | | | | |
|---|---|---|---|---|
| JP | 60-001801 A | | 1/1985 | |
| JP | S63-217648 A | | 9/1988 | |
| JP | 02-238601 A | | 9/1990 | |
| JP | 08-306861 A | | 11/1996 | |
| JP | 10-247763 | * | 3/1997 | ............... H05K 1/02 |
| JP | 10-247763 A | | 9/1998 | |
| JP | 2002-503026 A | | 1/2002 | |
| JP | 2005-101178 A | | 4/2005 | |
| JP | 2007-273661 | * | 3/2006 | ............. H01L 23/36 |
| JP | 2007-273661 A | | 10/2007 | |
| JP | 2009-200258 | * | 2/2008 | ............. H01L 23/36 |
| JP | 2009-105166 A | | 5/2009 | |
| JP | 2010-287842 | * | 6/2009 | ............... H01C 3/02 |
| JP | 2009-200258 A | | 9/2009 | |
| JP | 2010-287842 A | | 12/2010 | |
| JP | 2013-214576 A | | 10/2013 | |
| JP | 2013-239697 A | | 11/2013 | |
| TW | 201338055 A | | 9/2013 | |
| WO | WO-99/40590 A1 | | 8/1999 | |

OTHER PUBLICATIONS

Extended European Search Report, issued in corresponding European Patent Application No. EP 15735609.8, dated Aug. 14, 2017.
Office Action (part of Search Report) issued in corresponding Chinese Patent Application No. CN201580003821.3, dated Sep. 4, 2017.
Office Action (part of Search Report) issued in corresponding Taiwanese Patent Application No. TW104100548, dated Apr. 18, 2018.

* cited by examiner

RESISTOR AND METHOD FOR MANUFACTURING RESISTOR

TECHNICAL FIELD

The present invention relates to a resistor which includes a chip resistive element having a resistive element formed on one surface of a ceramic substrate and a metal electrode, a metal terminal that is electrically connected to the metal electrode, and a heat sink made of Al or an Al alloy, and a method for manufacturing the resistor.

Priority is claimed on Japanese Patent Application No. 2014-001739, filed Jan. 8, 2014, the content of which is incorporated herein by reference.

BACKGROUND ART

As an example of an electronic circuit component, a resistor including a resistive element formed on one surface of a ceramic substrate and a metal terminal joined to the resistive element is widely used. In the resistor, Joule' heat is generated in accordance with the value of applied voltage, and the resistor generates heat. In order to efficiently dissipate the heat generated in the resistor, for example, a resistor including a heat-dissipating plate (heat sink) is proposed.

For example, Patent Document 1 proposes a resistor having a structure in which a metal terminal is joined to a ceramic substrate using an active metal method and a resistive element is formed in a joint portion of the metal terminal. In addition, a resistor having a structure in which a resistive element and a metal electrode are formed on a ceramic substrate and the metal electrode and a metal terminal are joined together by soldering method is proposed.

Furthermore, for example, Patent Document 2 proposes a resistor in which a silicon substrate including an insulating layer and a heat-dissipating plate (heat sink) are joined together by soldering method.

In addition, Patent Document 3 proposes a resistor a structure in which a resistive element and a metal electrode are formed on a ceramic substrate and the metal element and a metal terminal are joined together by soldering method.

CITATION LIST

Patent Documents

[Patent Document 1] Japanese Unexamined Patent Application, First Publication No. H02-238601
[Patent Document 2] Japanese Unexamined Patent Application, First Publication No. H08-306861
[Patent Document 3] Japanese Unexamined Patent Application, First Publication No. 2005-101178

DISCLOSURE OF INVENTION

Problems to be Solved by the Invention

Meanwhile, in a case in which a ceramic substrate and a metal terminal are joined together using an active metal method in which a brazing filler material such as Ag—Cu—Ti is used as described in Patent Document 1, the joining temperature is a relatively high temperature of, for example, 850° C., and thus there is a problem in that the resistive element is thermally deteriorated during joining. In addition, even in a case in which the ceramic s ibstrate and the metal terminal are joined together and then a resistive element is formed in the joint portion of the metal terminal, the joining temperature of the brazing filler material is high, and thus there is a problem in that a great residual stress is generated in the joint portion between the ceramic substrate and the metal terminal.

Meanwhile, in recent years, the above-described resistors have been used in applications in which a large current flows, and thus there are cases in which the resistive elements generate heat and thus reach a high temperature of 150° C. or higher. In a case in which a silicon substrate and a heat sink are joined together by soldering method as described in Patent Document 2, when the resistive element reaches a high temperature as described above, a soldering material deteriorates and thus a sufficient joint strength cannot be ensured, and there is a concern that it may become impossible to maintain the joint between the silicon substrate and the heat sink.

Meanwhile, in a case in which a resistive element and a metal electrode are formed on a ceramic substrate and the metal electrode and a metal terminal are joined together by soldering method, when the resistive element reaches a high temperature as described above, there is a concern that it may also become impossible to maintain the joint between the metal electrode and the metal terminal.

The present invention has been made in consideration of the above-described circumstance, and an object of the present invention is to provide a resistor which has excellent heat resistance arid is capable of suppressing deterioration of a resistive element or a joint portion during the manufacture of the resistor and a method for manufacturing the resistor.

Means for Solving the Problems

In order to achieve the above-described object, several aspects of the present invention provided resistors and methods for manufacturing the resistors as described below.

That is, a resistor of the present invention includes a chip resistive element formed on one surface of a ceramic substrate, wherein the chip resistive element includes a resistive element and a metal electrode; a metal terminal electrically connected to the metal electrode; and an Al member formed on the other surface of the ceramic substrate, in which the ceramic substrate and the Al member are joined together using an Al—Si-based brazing filler material, and the metal electrode and the metal terminal are respectively joined to a first end and a second end of a metal member having a melting point of 450°C. or higher, thereby being electrically connected to each other.

According to the resistor of the present invention, since the Al—Si-based brazing filler material having a higher melting point than a soldering material is used instead of the soldering material for the joint between the ceramic substrate and the Al member, even when the resistive element generates heat and thus reaches a high temperature, it is possible to maintain a sufficient joint strength between the ceramic substrate and the Al member, and the heat resistance is excellent. In addition, the metal electrode and the metal terminal are respectively joined to the first end and the second end of the metal member having a melting point of 450° C. or higher, whereby the metal electrode and the metal terminal are electrically connected to each other through the metal member, and thus the metal electrode and the metal terminal are favorably joined together, and the joint reliability can be improved. In addition, since the metal electrode and the metal terminal are joined together through the metal member without using a soldering material, even when the resistive element generates heat and thus reaches a high temperature, it is possible to maintain a sufficient joint strength, and the heat resistance is excellent. For example, it is possible to ensure heat resistance to 300° C. or higher. In addition, when the metal electrode and the metal terminal are joined together at a temperature lower than the joint temperature of the brazing filler material, it is possible to suppress the degeneration of the resistive element or the joint portion during the manufacture of the resistor.

The metal member is an Al wire or Al tape.

When an Al wire or Al tape is used for the connection between the metal electrode and the metal terminal, it is possible to easily connect the metal electrode and the metal terminal with a low resistance.

The Al member is a laminate of a buffer layer made of Al having a purity of 99.98% or higher and a heat sink, and the buffer layer and the other surface of the ceramic substrate are joined together using an Al—Si-based brazing filler material When the buffer layer made of Al having a purity of 99.98% or higher and the heat sink are provided, it is possible to efficiently transfer heat generated in a chip resistive element to the heat sink and thus rapidly dissipate the heat. In addition, since the buffer layer is formed of high-purity Al having a purity of 99.98% or higher, the deformation resistance becomes small, thermal stress generated in the ceramic substrate due to the application of a cooling/heating cycle can be absorbed using the buffer layer, and it is possible to suppress generation of cracks due to the application of the thermal stress to the ceramic substrate.

The thickness of the buffer layer is in a range of 0.4 mm to 2.5 mm.

When the thickness of the buffer layer is smaller than 0.4 mm, there is a concern that it may be impossible to sufficiently buffer deformation caused by the thermal stress. In addition, when the thickness of the buffer layer exceeds 2.5 mm, there is a concern that it may become difficult to efficiently transfer heat to the heat sink.

The thickness of the ceramic substrate is in a range of 0.3 mm to 1.0 mm, and the thickness of the heat sink is in a range of 2.0 mm to 10.0 mm.

When the thickness of the ceramic substrate is set in a range of 0.3 mm to 1.0 mm, it is possible to satisfy both the strength of the ceramic substrate and the reduction of the thickness of the entire resistor. In addition, when the thickness of the heat sink is set in a range of 2.0 mm to 10.0 mm, it is possible to ensure a sufficient thermal capacity and reduce the thickness of the entire resistor.

The chip resistive element and the metal terminal are partial covered with an insulating sealing resin, and the sealing resin is a resin having a thermal expansion coefficient in a range of 8 ppm/° C. to 20 ppm/° C.

In this case, since the chip resistive element and the metal terminal are molded using the insulating sealing resin, it is possible to prevent current leakage and to realize high pressure resistance of the resistor. In addition, when a resin having a thermal expansion coefficient (linear expansion coefficient) in a range of 8 ppm/° C. to 20 ppm/° C. is used as the sealing resin, it is possible to suppress a volume change caused by the thermal expansion of the sealing resin due to the heat generation from the resistive element at a minimum level. Therefore, it is possible to prevent the occurrence of a disadvantage such as poor conduction caused by the damage of the joint portion due to an excess stress applied to the chip resistive element or the metal terminal which is covered with the insulating sealing resin.

The Al member forms a curved surface on a opposite surface which is located opposite to a joint surface between the ceramic substrate and the Al member, the curved surface curving in a direction opposite to the ceramic substrate and forming the bottom of a curve in a central region of the opposite surface; and a degree of curving of the opposite surface is in a range of 30 μm/50 mm to 700 μm/50 mm.

The joint surface between the Al member and the ceramic substrate is likely to curve due to a difference in the thermal expansion coefficient therebetween. As a result, the opposite surface opposite to the joint surface is likely to become a curved surface that curves opposite to the ceramic substrate. However, when the degree of curving of the opposite surface is set in a range of 30 μm/50 mm to 700 μm/50 mm, even in a ease in which a cooler is further formed on the opposite surface, it is possible to ensure adhesiveness between the Al member and the cooler. In addition, when the degree of curving of the opposite surface is set in a range of 30 μm/50 mm to 700 μm/50 mm, the generation of an excess curving stress in the joint surface between the Al member and the ceramic substrate is suppressed, and it is possible to prevent the Al member and the ceramic substrate from peeling away from each other.

A method for manufacturing a resistor of the present invention eludes a step of disposing an Al—Si-based brazing filler material between the ceramic substrate and the Al member and pressurizing them in a lamination direction under heating, thereby joining the ceramic substrate and the Al member using the Al—Si-based brazing filler material; a step of positioning the metal terminal on a surface of the metal electrode using an adhesive; and a step of respectively bringing the metal terminal and the metal electrode into contact with the first end and the second end of the metal member and applying ultrasonic waves to them, thereby respectively joining the metal electrode and the metal terminal to the first end and the second end of the metal member.

According to the method for manufacturing a resistor of the present invention, the Al—Si-based brazing filler material having a higher melting point than a soldering material is used instead of the soldering material for the joint between the ceramic substrate and the Al member, whereby, even when the resistive element generates heat and thus reaches a high temperature, it is possible to maintain a sufficient joint strength between the ceramic substrate and the Al member and to manufacture a resistor having excellent heat resistance. In addition, the metal electrode and the metal terminal are respectively brought into contact with the first end and the second end of the metal member and are joined thereto by applying ultrasonic waves, whereby the metal electrode and the metal terminal are favorably joined together, and it is possible to improve the joint reliability. In addition, since the metal electrode the metal terminal are joined together through the metal member by process of ultrasonic joining without using the soldering material, even when the resistive element generates heat and thus reaches a high temperature, it is possible to maintain a sufficient joint strength and to manufacture a resistor having excellent heat resistance.

The method for manufacturing a resistor includes a step of disposing a framework so as to surround a periphery of the chip resistive element; and a step of filling the inside of the framework with the softened sealing resin.

In this case, since the chip resistive element and the metal terminal are molded using the insulating sealing resin, it is possible to prevent current leakage and to manufacture a resistor having a high pressure resistance. In addition, the chip resistive element and the metal terminal are covered with the sealing resin, and it is possible to manufacture a resistor in which the occurrence of a disadvantage such as poor conduction due to the damage of the joint portion caused by the application of an excess stress to the chip resistive element or the metal terminal is prevented.

Effects of the Invention

According to the present invention, it is possible to provide a resistor which has excellent heat resistance and is capable of suppressing deterioration of a resistive element or a joint portion during the manufacture of the resistor and a method for manufacturing the resistor.

BEST MODE FOR CARRYING OUT THE INVENTION

Figure 1:
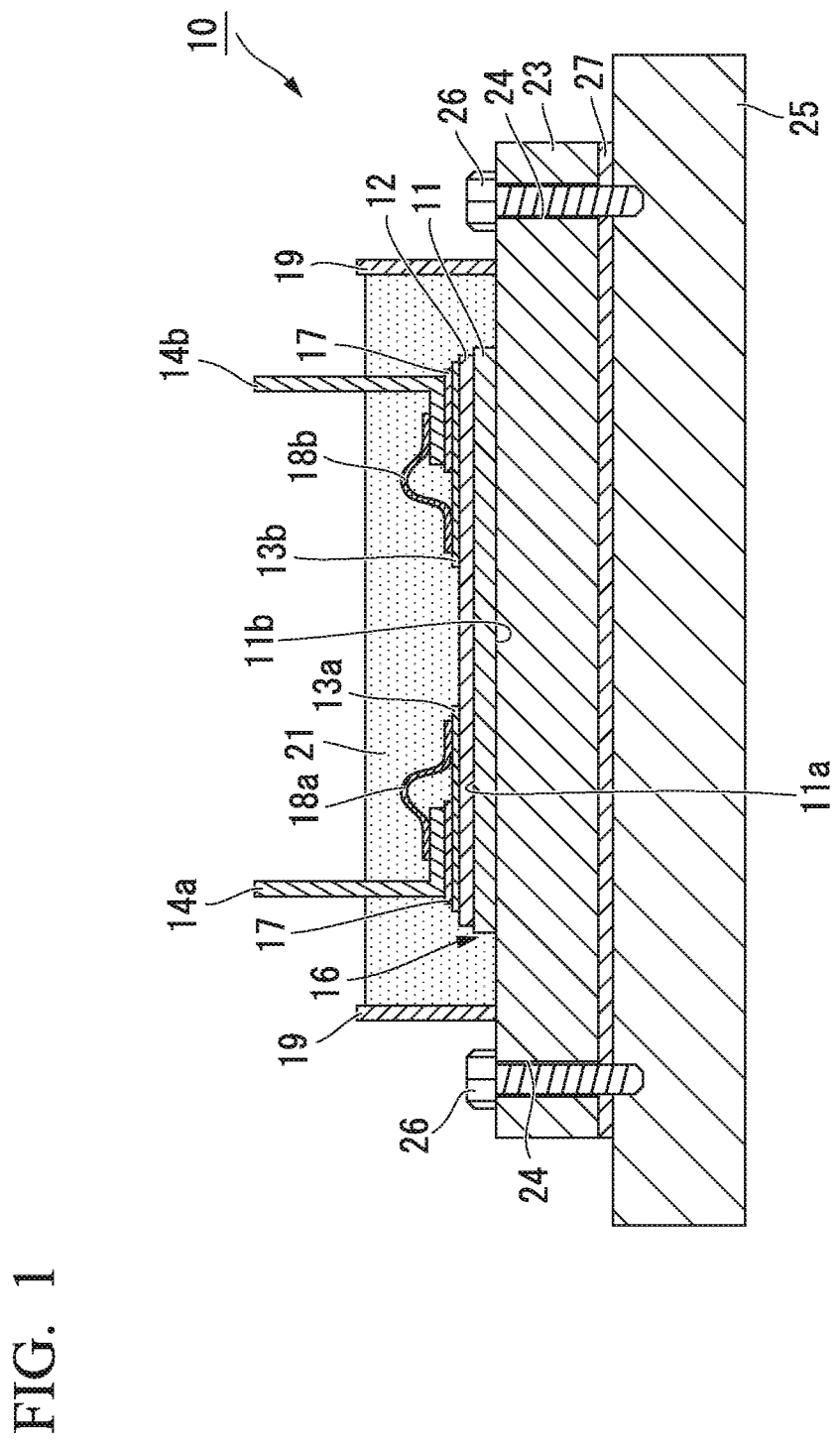
FIG. 1 is a sectional view of a resistor according to a first embodiment of the present invention.

Hereinafter, a resistor of the present invention and a method for manufacturing this resistor will be described with reference to the accompanying drawings.

Meanwhile, individual embodiments described below are specific descriptions for better understanding of the gist of the invention and does not limit the present invention unless particularly otherwise described. In addition, in the drawings used in the following description, there are cases in which, for convenience, parts acting as main parts are shown in an enlarged manner in order for easy understanding of the characteristics of the present invention, and the dimensional ratios and the like between individual constitutional elements do not always coincide with those in actual cases.

(Resistor: First Embodiment)

A first embodiment of the resistor of the present ion will be described with reference to attached FIG. 1.

FIG. 1 is a sectional view showing a section of a resistor of the first embodiment in a lamination direction. The resistor 10 according to the first embodiment includes a ceramic substrate 11 and a chip resistive element 16 formed on one surface 11a of the ceramic substrate 11 so as to superimpose the chip resistive element 16 on the ceramic substrate 11. The chip resistive element 16 has a resistive element 12 and metal electrodes 13a and 13b. In addition, metal terminals 14a and 14b are disposed so as to respectively superimpose the metal terminals 14a and 14b on the metal electrodes 13a and 13b through adhesive layers 17. The metal electrode 13a and the metal terminal 14a are electrically connected to each other using a metal member 18a, and the metal electrode 13b and the metal terminal 14b are electrically connected to each other using a metal member 18b.

Furthermore, around the chip resistive element 16, a framework 19 is disposed so as to surround the chip resistive element 16 with a gap therebetween. In addition, the inside of the framework 19 is filled with a sealing resin 21. The sealing resin 21 is formed so as to partially cover the chip resistive element 16 or the metal terminals 14a and 14b.

On the other surface 11b of the ceramic substrate 11, an Al member is disposed so as to superimpose the Al member on the surface 11b.

In the present embodiment, a heat sink 23 (heat-dissipating member) is used as the Al member. The above-described joint structure between the ceramic substrate 11 and the heat sink 23 will be described below in detail.

Near the circumferential edge of the heat sink 23, multiple screw holes 24 are formed.

Furthermore, a cooler 25 is mounted on a opposite surface which is located opposite to the joint surface on which the heat sink 23 is joined to the ceramic substrate 11. The cooler 25 is fastened to the heat sink 23 using screws 26 penetrating the screw holes 24 in the heat sink 23. Meanwhile, it is preferable that a highly thermally conductive grease layer 27 is further formed between the cooler 25 and the heat sink 23.

The ceramic substrate 11 prevents the electrical connection between the resistive element 12 and the metal electrodes 13a and 13b and the conductive heat sink 23, and, in the first embodiment, the ceramic substrate 11 is a plate-like member made of highly insulating aluminum nitride (AlN). In addition, the thickness of the ceramic substrate 11 made of AlN may be in a range of for example, 0.3 mm to 1.0 mm, is more preferably set to be in a range of 0.5 mm to 0.85 mm, and is set to be 0.635 mm in the first embodiment.

The thickness of the ceramic substrate 11 can be measured using a caliper or the like, When the thickness of the ceramic substrate 11 is smaller than 0.3 mm, there is a concern that it may become impossible to ensure a sufficient strength with respect to stress applied to the ceramic substrate 11. In addition, when the thickness of the ceramic substrate 11 exceeds 1.0 mm, the thickness of the entire resistor 10 increases, and there is a concern that it may become difficult to reduce the thickness thereof. Therefore, when the thickness of the ceramic substrate 11 is set to be in a range of, for example, 0.3 mm to 1.0 mm, it is possible to satisfy both the strength of the ceramic substrate 11 and the reduction of the thickness of the entire resistor 10.

The resistive element 12 is intended to function as an electrical resistance when a current flows in the resistor 10, and examples of a constitutional material thereof include a Ta—Si-based thin film resistive element and a $RuO_2$ thick film resistive element. In the first embodiment, the resistive element 12 is constituted of a Ta—Si-based thin film resistive element, and the thickness thereof is set to, for example, 0.5 µm.

The metal electrodes 13a and 13b are electrodes provided on the resistive element 12 and, in the first embodiment, are constituted of Cu. In addition, the thicknesses of the metal electrodes 13a and 13b are set to be in a range of, for example, 2 µm to 3 µm and, in the first embodiment, are set to be 1.6 µm.

Meanwhile, in the present embodiment, Cu constituting the metal electrodes 13a and 13b includes pure Cu or a Cu alloy. In addition, the constitutional material of the metal electrodes 13a and 1.3b is not limited to Cu, and it is possible to employ, for example, a variety of metals having a high conductivity such as Al or Ag.

The metal terminals 14a and 14b are electrical terminals having an outer shape that curves in a substantially L shape and are electrically connected to the metal electrodes 13a and 13b through the metal members 18a and 18b respectively. The first end side of each of the metal terminals 14a and 14b is fixed to the surface of the metal electrode 13a or 13b through the adhesive layer 17. In addition, the second end side of each of the metal terminals 14a and 14b protrudes from the sealing resin 21 and is exposed outside. In the first embodiment, the metal terminals 14a and 14b are constituted of Cu like the metal electrode 13. In addition, the thickness of the metal terminal 14 is set to be in a range of 0.1 mm to 0.5 mm and, in the first embodiment, is set to be 0.3 mm.

The resistor 10 is connected to an external electronic circuit or the like through the metal terminals 14a and 14b.

The metal terminal 14a acts as a terminal having one polarity in the resistor 10, and the metal terminal 14b acts as a terminal having the other polarity in the resistor 10.

The metal members 18a and 18b are long and thin linear members, such as wires or tape, having a melting point of 450° C. or higher, and the metal members are, for example, Al wires formed of Al, Al tape, or the like. The first end side of each of the metal members 18a and 18b is joined to the metal electrode 13a or 13b, and the second end side of each thereof is joined to the metal terminal 14a or 14b.

The upper limit value of the melting point of the metal members 18a and 18b is preferably 1,500° C. or lower and is more preferably in a range of 550° C. to 1,100° C.

Between the first end side of each of the metal member, 18a and 18b and each of the metal electrodes 13a and 13b, and between the second end side of each of the metal members 18a and 18b and each of the metal terminals 14a and 14b are directly joined together by process of ultrasonic joining. The ultrasonic joining is carried out by bringing the metal members 18a and 18b into close contact with the metal electrodes 13a and 13b and the metal terminals 14a and 14b and applying ultrasonic waves. By the above-described constitution, the metal electrodes 13a and 13b and the metal terminals 14a and 14b are electrically connected to each other respectively through the metal members 18a and 18b.

When the metal electrodes 13a and 13b and the metal terminals 14a and 14b are electrically connected to each other using long and thin linear members such as Al wires or Al tape, there is no concern that poor conduction between the metal electrodes 13a and 13b and the metal terminals 14a and 14b may occur even when the resistive element 12 is subjected to a temperature cycle in which the resistive element generates heat when a current flows and cools when a current does not flow in a repetitive manner.

Meanwhile, in the present embodiment, Al constituting the metal members 18a and 18b includes pure Al or an Al alloy. In addition, the constitutional material of the metal members 18a and 18b is not limited to Al, and it is possible to employ, for example, a wire-shape member or a tape-shape member made of a variety of metals having a melting point of 450° C. or higher and a high conductivity such as Cu or Ag.

The adhesive layers 17 are provided to position and fix the metal terminals 14a and 14b, and, for example, a resin-based adhesive is used. Since the metal electrodes 13a and 13b and the metal terminals 14a and 14b are electrically connected to each other through the metal members 18a and 18b as described above, the adhesive layers 17 may be made of an insulating material.

The framework 19 is constituted of, for example, a heat-resistant resin plate. In addition, as the seating resin 21 loaded into the inside of the framework 19, for example, an insulating resin having thermal expansion coefficient (linear expansion coefficient) in a range of 8 ppm/° C. to 20 ppm/° C. in a temperature range of 30° C. to 120° C. is used. The thermal expansion coefficient (linear expansion coefficient) of the sealing resin 21 is more preferably in a range of 12 ppm/° C. to 18 ppm/° C. Examples of the insulating resin having the above-described thermal expansion coefficient include resins obtained by introducing a $SiO_2$ filler into an resin. In this case, the sealing resin 21 desirably has a composition including 72% to 84% of the $SiO_2$ filler and 16% to 28% of the epoxy resin.

The thermal expansion coefficient (linear expansion coefficient) of the sealing resin 21 can be measured using a dilatometer (TD5000SA manufactured by METZSCH).

When an insulating resin having a thermal expansion coefficient in a range of 8 ppm/° C. to 20 ppm/° C. in a temperature range of 30° C. to 120° C. is used as the sealing resin 21, it is possible to suppress a volume change caused by the thermal expansion of the sealing resin 21 due to the heat generation from the resistive element 12 at a minimum level. In addition, it is possible to prevent the occurrence of a disadvantage such as poor conduction caused by the damage of the joint portion due to an excess stress applied to the chip resistive element 16 or the metal terminal 14a or 14b which is covered with the sealing resin 21.

Meanwhile, it is also preferable that the Al member is constituted of a laminate of a buffer layer made of Al having a purity of 99.98% or higher and a heat sink, and the buffer layer and the other surface of the ceramic substrate are joined together using an Al—Si-based brazing filler material.

The purity of Al in the buffer layer can be measured using an emission spectrophotometer (4460 manufactured by Thermo Fisher Scientific K. K.).

The heat sink (heat-dissipating member) 23 which is the Al member is intended to remove heat generated from the resistive element 12 and is formed of Al or an Al alloy having favorable thermal conductivity. In the first embodiment, the heat sink 23 is constituted of an A6063 alloy (Al alloy).

The heat sink 23 is preferably formed so that the thickness in the lamination direction falls in a range of 2.0 mm to 10.0 mm and is more preferably formed so that the thickness falls in a range of 3.0 mm to 5.0 mm. When the thickness of the heat sink 23 is smaller than 2.0 mm, there is a concern that the heat sink 23 may deform when stress is applied to the heat sink 23. In addition, since the heat capacity is too small, there is a concern that it may be impossible to sufficiently absorb and dissipate heat generated from the resistive element 12. On the other hand, when the thickness of the heat sink 23 exceeds 10.0 mm, it becomes difficult to reduce the thickness of the entire resistor 10 due to the thickness of the heat sink 23, and there is a concern that the weight of the entire resistor 10 may become too heavy.

The thickness of the heat sink 23 can be measured using a caliper or the like.

The heat sink 23 and the other surface 11b of the ceramic substrate 11 are joined together using an Al—Si-based brazing filler material. The Al—Si-based brazing filler material has a melting point in a range of approximately 600° C. to 700° C. When the heat sink 23 and the ceramic substrate 11 are joined together using the Al—Si-based brazing filler material, it is possible to prevent the derogation of the heat resistance and thermal deterioration during joining at the same time.

For example, in a case in which the heat sink and the ceramic substrate are joined together using solder as in the related art, since the melting point of the solder is low (approximately 200° C. to 250° C.), in a case in which the resistive element 12 reaches a high temperature, there is a concern that the heat sink and the ceramic substrate may peel away from each other. Meanwhile, as an example of the related art in which the heat resistance matters, in a case in which the heat sink and the ceramic substrate are joined together using an Ag—Cu—Ti-based brazing filler material, the melting point (joining temperature) reaches 850° C., and the heat resistance is enhanced; however, when the temperature increased to 850° C. or higher during joining, the resistive element causes thermal deterioration, and there is a concern that it may be impossible to exhibit predetermined performance. Therefore, when the heat sink 23 and the ceramic substrate 11 are joined together rising the Al—Si-based brazing filler material as in the present embodiment, the heat resistance is significantly enhanced compared with that in the case of joining by soldering method, and it becomes possible to reliably prevent the resistive element 12 from being thermally deteriorated during joining compared with the case of joining using an Ag—Cu—Ti-based brazing filler material.

The opposite surface which is located opposite to the joint surface between the heat sink 23 and the ceramic substrate 11, that is, the surface which comes into contact with the cooler 25, in some cases, slightly curves due to the joining between the heat sink 23 and the ceramic substrate 11. This is because the thermal expansion coefficient of Al constituting the heat sink 23 is greater than the thermal expansion coefficient of the ceramic substrate 11. Therefore, when the heat sink and the ceramic substrate are joined together at a high temperature and then are cooled to approximately room temperature, the opposite surface of the heat sink 23 (the surface which comes into contact with the cooler 25) curves, forming the bottom f a curve in the central region of the opposite surface, so as to protrude in a direction opposite to the ceramic substrate 11.

When the degree of curving of the opposite surface (the surface which comes contact with the cooler 25) of the heat sink 23 is preferably set in a range of 30 μm/50 mm to 700 μm/50 mm and is more preferably set in a range of 30 μm/50 mm to 100 μm/50 mm, even in a case in which the cooler 25 is further provided on the heat sink 23, it is possible to ensure adhesiveness between the heat sink 23 and the cooler 25. In addition, the generation of an excess curving stress in the joint surface between the heat sink 23 and the ceramic substrate 11 is suppressed, and it is possible to prevent the heat sink 23 and the ceramic substrate 11 from peeling away from each other.

The degree of curving of the opposite surface of the heat sink 23 can be measured using a flatness measurement and analysis system (THERMIORE PS 200 manufactured by Akrometrix) in which the shadow moire technique is used.

The cooler 25 cools the heat sink 23 and prevents an increase in the temperature of the heat sink 23 in conjunction with the heat-dissipating function of the heat sink 23. The cooler 25 may be, for example, either an air cooling-type cooler or a water cooling-type cooler. The cooler 25 is fastened to the heat sink 23 using the screws 26 and 26 penetrating the screw holes 24 and 24 formed in the heat sink 23.

In addition, it is preferable that the highly thermally conductive grease layer 27 is further formed between the cooler 25 and the heat sink 23. The grease layer 27 enhances adhesiveness between the cooler 25 and the heat sink 23 and smoothly transfers heat from the heat sink 23 toward the cooler 25. As grease constituting the grease layer 27, highly heat-resistant grease which has excellent thermal conducting properties and excellent heat resistance is used.

(Method for Manufacturing Resistor: First Embodiment)

Next, a method for manufacturing the resistor 10 according to the first embodiment will be described with reference to FIGS. 2A to 2D, 3A, 3B, and 4.

FIGS. 2A to 2D, 3A, and 3B are sectional views showing the method for manufacturing the resistor of the first embodiment in a stepwise manner. In addition, FIG. 4 is a flowchart showing individual steps in the method for manufacturing the resistor according to the first embodiment.

Figure 2A:
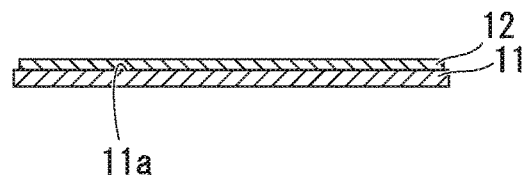
FIG. 2A is a sectional view of a method for manufacturing a resistor according to first embodiment (resistive element-forming step).

First, as shown in FIG. 2A, the ceramic substrate 11 made of, for example, AlN having a thickness in a range of 0.3 mm to 1.0 mm is prepared. In addition, the resistive element 12 made of a Ta—Si-based thin film having a thickness of approximately 0.5 μm is formed on one surface 11a of the ceramic substrate 11 using, for example, a sputtering method (resistive element-forming step: S01).

Figure 2B:
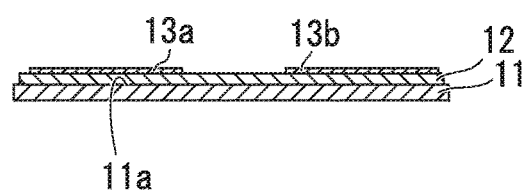
FIG. 2B is a sectional view of the method for manufacturing a resistor according to the first embodiment (metal electrode-forming step).

Next, as shown in FIG. 2B, the metal electrodes 13a and 13b made of, for example, Cu plates having a thickness in a range of approximately 2 to 3 μm are formed at predetermined positions on the resistive element 12 using, for example, a sputtering method (metal electrode-forming step: S02). Therefore, the chip resistive element 16 is formed on the surface 11a of the ceramic substrate 11. Meanwhile, it is also preferable to provide a constitution in which a foundation layer made of Cr is formed in advance below the Cu layer, thereby enhancing the adhesiveness between the resistive element 12 and the metal electrodes 13a and 13b.

Figure 2C:
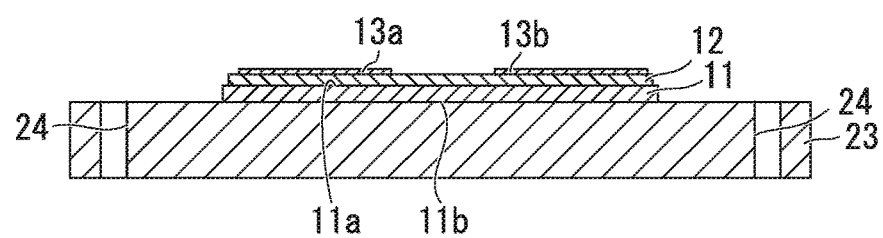
FIG. 2C is a sectional view of the method for manufacturing a resistor according to the first embodiment (heat sink-joining step).

Next, as shown in FIG. 2C, the heat sink 23 is joined to the other surface 11b of the ceramic substrate 11 (heat sink-joining step: S03).

In joining the other surface 11b of the ceramic substrate 11 and the heat sink 23, an Al—Si-based brazing filler material foil is inserted between the other surface 11b of the ceramic substrate 11 and the heat sink 23. In addition, in a vacuum heating furnace, a welding pressure in a range of 0.5 kgf/cm$^2$ to 10 kgf/cm$^2$ is applied in the lamination direction, the heating temperature in the vacuum heating furnace is set to be in a range of 640° C. to 650° C., and the ceramic substrate and the heat sink are held for 10 minutes to 60 minutes. Therefore, the Al—Si-based brazing filler material foil disposed between the other surface 11b of the ceramic substrate 11 and the heat sink 23 is melted, and the ceramic substrate 11 and the heat sink 23 are joined together.

In the joint portion between the ceramic substrate 11 and the heat sink 23 obtained as described above, the heat resistance is significantly enhanced compared with joining by process of soldering, and it is also possible to prevent the previously-formed resistive element 12 from causing thermal deterioration since a high temperature of 800° C. or higher is not required during joining.

When the heat sink 23 and the ceramic substrate 11 are joined together and are cooled to room temperature from the melting point of the Al—Si-based brazing filler material foil, there are cases in which, due to the difference in the thermal expansion coefficient between the heat sink 23 and the ceramic substrate 11, the opposite surface which is located opposite to the joint surface between the heat sink 23 and the ceramic substrate 11 curves, forming the bottom of a curve in the central region thereof, so as to protrude in a direction opposite to the ceramic substrate 11. When the degree of curving of the opposite surface (the surface which comes into contact with the cooler 25) of the heat sink 23 is set in a range of 30 µm/50 mm to 700 µm/50 mm, it is possible to ensure adhesiveness between the heat sink 23 and the cooler 25 when the cooler 25 is provided on the heat sink 23 in the subsequent step. In addition, the generation of an excess curving stress in the joint surface between the heat sink 23 and the ceramic substrate 11 is suppressed.

Figure 2D:
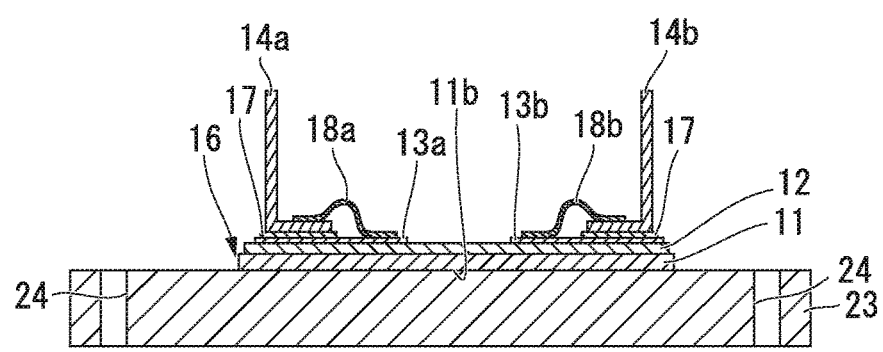
FIG. 2D is a sectional view of the method for manufacturing resistor according to the first embodiment (metal member-joining step).

Next, as shown in FIG. 2D, the metal terminals 14a and 14b are temporarily secured (positioned and fixed) to the metal electrodes 13a and 13b respectively using the adhesive layers 17. As the metal terminals 14a and 14b, for example, any Cu plates which have a thickness of approximately 0.3 mm and have a section that is curved in a substantially L shape may be used. In addition, the first end sides of the metal members 18a and 18b made of, for example, Al wires or Al tape are brought into contact with the metal electrode, 13a and 13b, and the second end sides of the metal members 18a and 18b are brought into contact with the metal terminals 14a and 14b, respectively. In addition, the contact portions therebetween are pressed (pressurized) under the application of ultrasonic waves, whereby the joint portions are ultrasonic-joined (metal member-joining step: S04). Therefore, the metal electrodes 13a and 13b and the metal terminals 14a and 14b are electrically connected to each other respectively using the metal members 18a and 18b.

Next, as shown in 3A, the framework 19 is disposed on the surface 11a of the ceramic substrate 11 so as to surround the periphery of the chip resistive element 16. In addition, the softened insulating resin is loaded into the inside of the framework 19, thereby forming the sealing resin 21 that partially seals the chip resistive element 16 and the metal terminals 14a and 14b (sealing resin-forming step: S05).

Figure 3A:
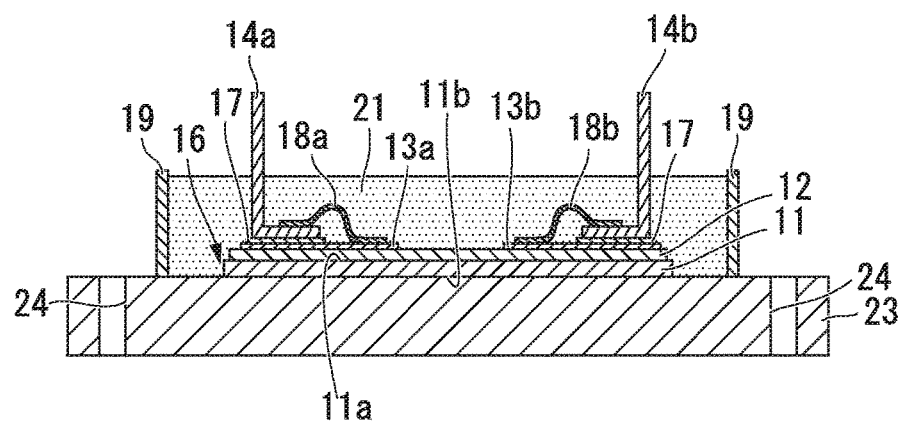
FIG. 3A is a sectional view of the method for manufacturing a resistor according to the first embodiment (sealing resin-forming step)
Figure 3B:
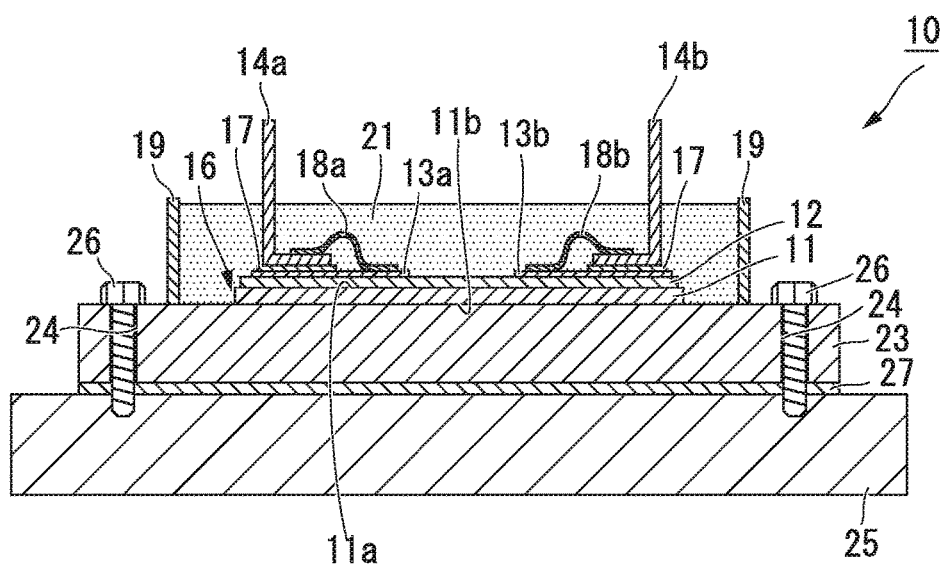
FIG. 3B is a sectional view of the method for manufacturing a resistor according to the first embodiment (cooler-mounting step).
Figure 4:
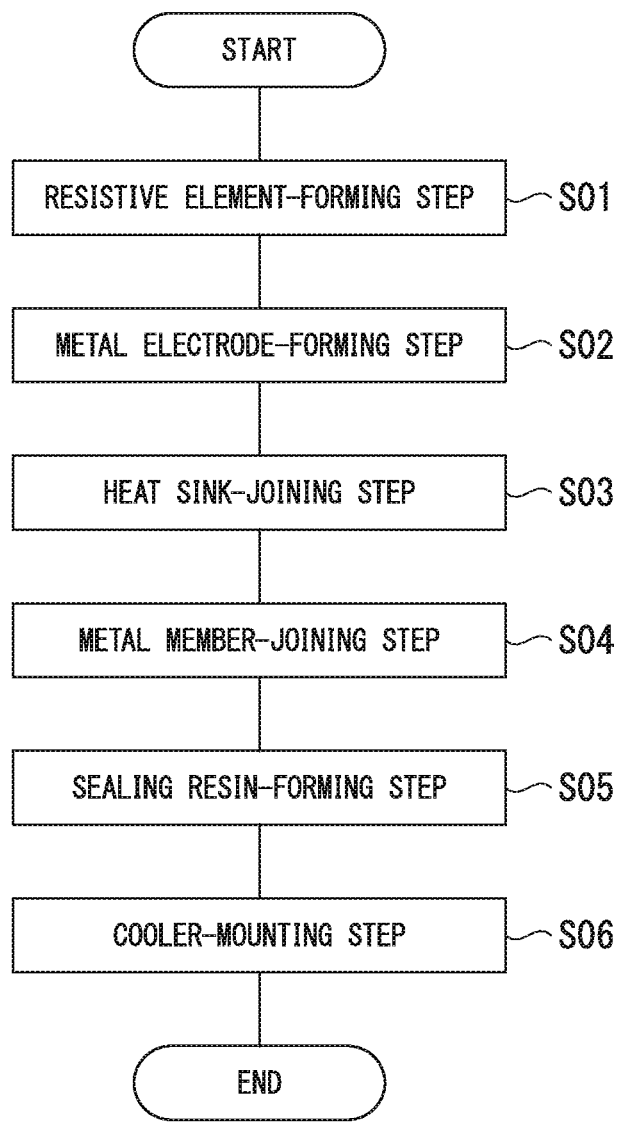
FIG. 4 is a flowchart of the method for manufacturing resistor according to the first embodiment.

Next, as shown in FIG. 3B, the grease layer 27 made of heat-resistant grease is formed on the lower surface of the heat sink 23, and then the cooler 25 is mounted on the heat sink 23 using the screws 26 and 26 (cooler-mounting step: S06).

By methods of the above-described steps, the resistor 10 according to the first embodiment can be manufactured.

According to the resistor 10 in the present embodiment having the above-described constitution and the method for manufacturing the same, since the ceramic substrate 11 and the heat sink 23 are joined together using the Al—Si-based brazing filler material, even when the resistive element 12 generates heat and thus reaches a high temperature, a sufficient joint strength can be maintained, and the heat resistance is excellent compared with a case in which the ceramic substrate and the heat sink are joined together using a soldering material. In addition, since it is possible to decrease the joining temperature compared with a case in which the ceramic substrate and the heat sink are joined together using an Ag—Cu—Ti-based brazing filler material as in the related art, it becomes possible to reliably prevent the thermal deterioration of the resistive element 12 during joining. In addition, it is also possible to reduce a thermal load on the ceramic substrate 11 and the resistive element 12, to simplify the manufacturing steps, and to reduce the manufacturing costs.

In addition, in the present embodiment, since the metal electrodes 13a and 13b and the metal terminals 14a and 14b are electrically connected to each other using long and thin linear members such as Al wires or Al tape, and the metal electrodes 13a and 13b and the metal terminals 14a and 14b are not directly joined together using a conductive layer or the like, there is no concern that poor conduction between the metal electrodes 13a and 13b and the metal terminals 14a and 14b may occur even when the resistive element 12 is subjected to a temperature cycle in which the resistive element generates heat when a current flows and cools when a current does not flow in a repetitive manner.

In addition, when the thickness of the ceramic substrate 11 made of AlN is set in a range of 0.3 mm to 1.0 mm, it is possible to suppress generation of cracks in the ceramic substrate 11 even when the number of times of heat generation in the resistive element 12 is large.

Furthermore, when the thicknesses of the metal terminals 14a and 14b made of Cu are set to 0.1 mm or larger, it is possible to ensure a strength that is sufficient for a terminal and to let a relatively large current now. In addition, when the thicknesses of the metal terminals 14a and 14b are set to 0.3 mm, it is possible to suppress generation of cracks in the ceramic substrate 11 even when the number of times of heat generation in the resistive element 12 is large.

In addition, when an insulating resin having a thermal expansion coefficient (linear expansion coefficient, in a range of 8 ppm/° C. to 20 ppm/° C. is used as the seal resin 21, it is possible to suppress a volume change caused by the thermal expansion of the sealing resin 21 due to the heat generation from the resistive element 12 at a minimum level. With the above-described constitution, it is possible to prevent the occurrence of a disadvantage such as poor conduction caused by the damage of the joint portion due to an excess stress applied to the chip resistive element 16 or the metal terminal 14a or 14b which is covered with the sealing resin 21.

In addition, when the cooler 25 is provided on the heat sink 23, it is possible to ensure adhesiveness between the heat sink 23 and the cooler 25 by setting the degree of curving of the opposite surface which is located opposite to the joint surface between the heat sink 23 and the ceramic substrate 11 in a range of 30 µm/50 mm to 700 µm/50 mm. Particularly, in the present embodiment, the multiple screw holes 24 and 24 are formed near the circumferential edge of the heat sink 23, and the heat sink 23 and the cooler 25 are fastened together using the screws 26 and 26 penetrating the screw holes 24 and 24, it is possible to improve the adhesiveness between the heat sink 23 and the cool 25. In addition, it is possible to suppress generation of an excess curving stress in the joint surface between the heat sink 23 and the ceramic substrate 11.

(Resistor: Second Embodiment)

A second embodiment of the resistor of the present invention will be described with reference to attached FIG. 5.

Meanwhile, in the following description, the same constitution as in the resistor of the first embodiment will be given the same reference sign and will not be described in detail.

In addition, regarding the methods for measuring the respective values as well, the same methods as in the first embodiment will be applied.

Figure 5:
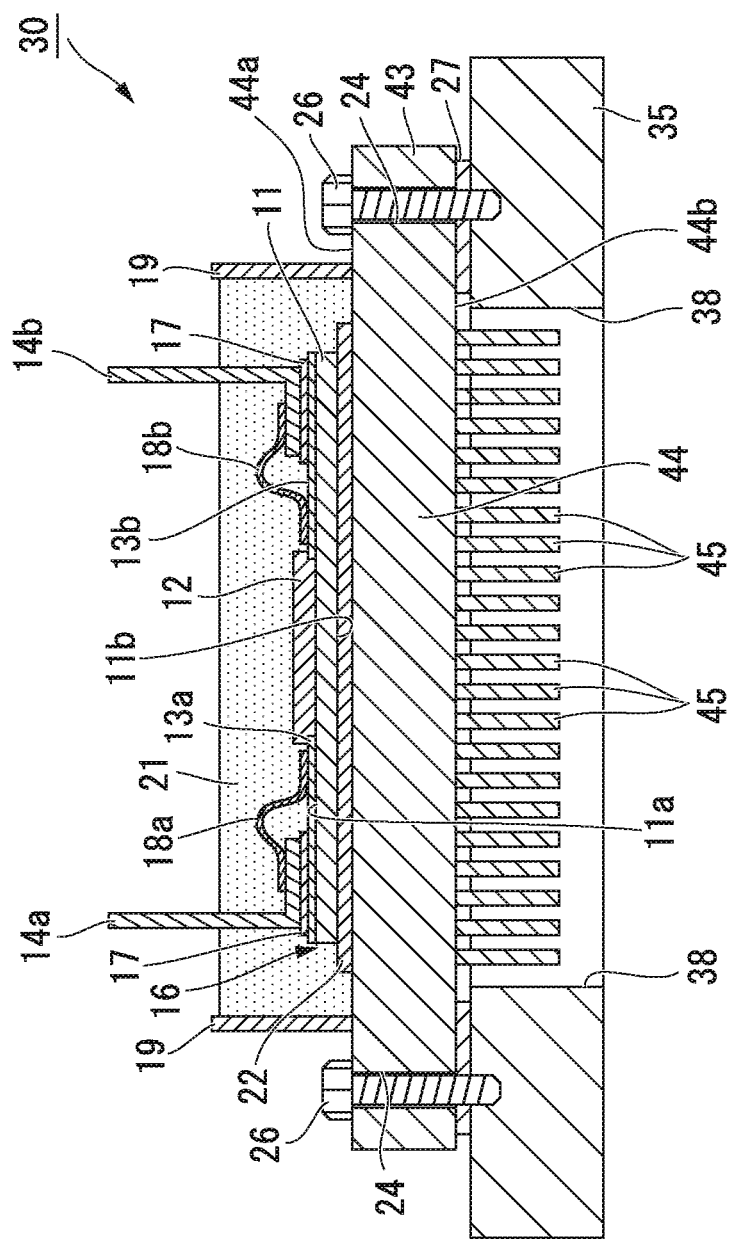
FIG. 5 is a sectional view of a resistor according to a second embodiment.

FIG. 5 is a sectional view showing a section of a resistor of the second embodiment in a lamination direction.

The resistor 30 according to the second embodiment includes the ceramic substrate 11 and the chip resistive element 16 formed on the surface 11a of the ceramic substrate 11 so as to superimpose the chip resistive element 16 on the ceramic substrate 11. The chip resistive element 16 has the resistive element 12 and the metal electrodes 13a and 13b. In addition, the metal terminals 14a and 14b are disposed so as to respectively superimpose the metal terminals 14a and 14b on the metal electrodes 13a and 13b through the adhesive layers 17. The metal electrode 13a and the metal terminal 14a are electrically connected to each other using the metal member 18a, and the metal electrode 13b and the metal terminal 14b are electrically connected to each other using the metal member 18b.

Furthermore, around the chip resistive element 16, the framework 19 is disposed so as to surround the chip resistive element 16 with a gap therebetween. In addition, the inside of the framework 19 is filled with the sealing resin 21. The sealing resin 21 is formed so as to partially cover the chip resistive element 16 or the metal terminals 14a and 14b.

In the second embodiment, the ceramic substrate 11 is constituted of alumina. In addition, the thickness of the ceramic substrate 11 made of alumina is set to be in a range of 0.3 mm to 1.0 mm, is more preferably set to be in a range of 0.3 mm to 0.85 mm, and, in the second embodiment, is set to be 0.38 mm.

In the second embodiment, the resistive element 12 is constituted of a $RuO_2$ thick film resistive element. In addition, the thickness of the resistive element 12 is set to be in a range of 5 μm to 10 μm and is specifically set to be 7 μm.

In the second embodiment, the metal electrodes 13a and 13b are constituted of Ag.

In addition, the thicknesses of the metal electrodes 13a and 13b are set to be in a range of 5 μm to 10 μm and, in the second embodiment, are set to be 7 μm. Meanwhile, in the present embodiment, Ag includes pure Ag or an Ag alloy.

In the second embodiment, the metal terminals 14a and 14b are constituted of Cu.

In addition, the thicknesses of the 14a and 14b are set to be in a range of 0.1 mm to 0.5 mm and, in the second embodiment, are set to be 0.3 mm. Meanwhile, in the present embodiment, Cu includes pure Cu or a Cu alloy.

To the other surface 11b of the ceramic substrate 11, an Al member is joined.

In the present embodiment, a laminate of a butter layer 22 and a heat sink 43 is used as the Al member. The ceramic substrate 11 and the buffer layer 22 are joined together using an Al—Si-based brazing filler material.

In addition, the buffer layer 22 and the heat sink 43 are joined together using an Al—Si-based brazing filler material. The Al—Si-based brazing filler material has a melting point in a range of approximately 600° C. to 700° C. When the ceramic substrate 11 and the buffer layer 22 and the buffer layer 22 and the heat sink 43 are joined together using the Al—Si-based brazing filler material respectively, it is possible to prevent the derogation of the heat resistance and thermal deterioration during joining at the same time.

The buffer layer 22 is, for example, a thin plate-shape member made of Al having a purity of 99.98% or higher. The thickness of the buffer layer may be in a range of, for example, 0.4 mm to 2.5 mm and is more preferably in a range of 0.6 mm to 2.0 mm. When the buffer layer is formed between the other surface 11b of the ceramic substrate 11 and the heat sink 43, it is possible to efficiently transfer heat generated in the chip resistive element 16 to the heat sink 43 and thus rapidly dissipate the heat.

The thickness of the buffer layer can be measured using a caliper or the like.

In addition, when the buffer layer is formed of Al having a purity of 99.98% or higher, the deformation resistance becomes small, thermal stress generated in the ceramic substrate 11 due to the application of a cooling/heating cycle can be absorbed using the buffer layer, and it is possible to suppress generation of cracks due to the application of the thermal stress to the ceramic substrate 11.

The heat sink 43 in the second embodiment is made up of a heat sink main body portion 44 and multiple fins 45 extending from an opposite surface 44b of the heat sink main body portion 44 to a joint surface 44a with the ceramic substrate 11. The multiple fins 45 are made of the same material as that of the heat sink main body portion 44, for example, Al or an Al alloy. The multiple fins 45 may be integrally formed with the heat sink main body portion 44, or the multiple fins 45 that have been formed as separate bodies may be mounted on the opposite surface 44b side of the heat sink main body portion 44.

The heat sink 43 including the multiple fins 45 formed on the heat sink main body portion 44 has a specific area that is significantly increased compared with that of the heat sink 43 described in the first embodiment. Therefore, it is possible to efficiently dissipate heat transferred due to heat generation in the chip resistive element 16 outside through the multiple fins 45.

On the opposite surface 44b to the joint surface 44a on which the heat sink main body portion 44 constituting the heat sink 43 is joined to the ceramic substrate 11, a cooler 35 is further mounted. The cooler 35 is fastened to the heat sink 43 using the screws 26 and 26 penetrating the screw holes 24 and 24 in the heat sink 43. Meanwhile, it is preferable that thee highly thermally conductive grease layer 27 is further formed between the cooler 35 and the heat sink 43.

In the cooler 35, an opening portion 38 is formed in order to expose the multiple fins 45 formed on the heat sink main body portion 44 outside. The opening portion 38 is a through hole that penetrates the cooler 35 in the thickness direction so as to surround the region in which the multiple fins 45 are formed. The multiple fins 45 are exposed outside through the opening portion 38, and the heat sink 43 is capable of efficiently dissipating heat. Meanwhile, it is also preferable to further form an electric fan or the like for forcibly blowing external air to the multiple fins 45 or absorbing air in the opening portion 38 of the cooler 35.

(Method for Manufacturing Resistor: Second Embodiment)

Next, a method for manufacturing the resistor 30 according the second embodiment will be described with reference to FIGS. 6A to 6D, 7A, 7B, and 8.

FIGS. 6A to 6D, 7A, and 7B are sectional views showing the method for manufacturing the resistor of the second embodiment in a stepwise manner. In addition, FIG. 8 is a flowchart showing individual steps in the method for manufacturing the resistor according to the second embodiment.

Figure 6A:
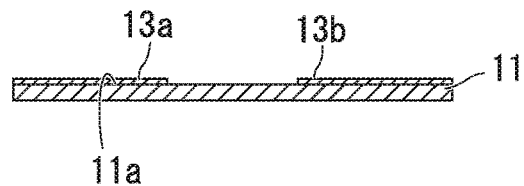
FIG. 6A is a sectional view of a method for manufacturing a resistor according to the second embodiment (metal electrode-forming step).

First, as shown in FIG. 6A, the metal electrodes 13a and 13b made of Ag are formed by printing, drying, and then firing at 850° C. Ag paste at predetermined positions on one surface of the ceramic substrate 11 using a thick film printing method (metal electrode-forming step: S11).

Figure 6B:
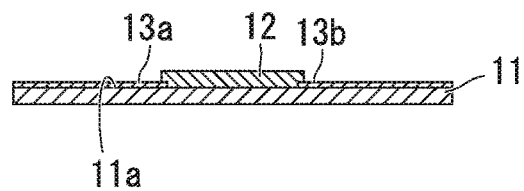
FIG. 6B is a sectional view of the method for manufacturing a resistor according to the second embodiment (resistive element-forming step).

Next, as shown in FIG. 6B, the thick film resistive element (resistive element) 12 made of $RuO_2$ is formed by printing, drying, and then firing at 850° C. $RuO_2$ paste on one surface of the ceramic substrate 11 on one surface of the ceramic substrate 11 having a thickness in a range of 0.3 mm to 1.0 mm using a thick film printing method (resistive element-forming step: S12).

Figure 6C:
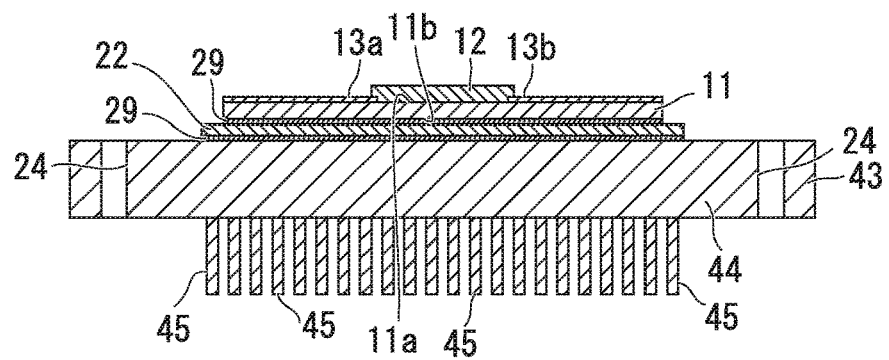
FIG. 6C is a sectional view of the method for manufacturing a resistor according to the second embodiment (buffer layer and heat sink-joining step).

Next, as shown in FIG. 6C, the buffer layer is formed on the other surface 11b of the ceramic substrate 11, and then the heat sink 43 including the multiple fins 45 is joined thereto (buffer layer and heat sink-joining step: S13). As the buffer layer 22, for example, a thin plate-shape member which has a thickness in a range of approximately 0.4 mm to 2.5 mm and is made of high-purity Al having a purity of 99.98% or higher may be used.

In joining the other surface 11b of the ceramic substrate 11, the buffer layer 22, and the heat sink 43, Al—Si-based brazing filler material foils 29 are inserted between the other surface 11b of the ceramic substrate 11 and the buffer layer 22 and between the buffer layer 22 and the heat sink 43, respectively. In addition, in a vacuum heating furnace, a welding pressure in a range of 0.5 $kgf/cm^2$ to 10 $kgf/cm^2$ is applied in the lamination direction, the heating temperature in the vacuum heating furnace is set in a range of 640° C. to 650° C., and the ceramic substrate 11, the buffer layer 22, and the heat sink 43 are held for 10 minutes to 60 minutes. Therefore, the Al—Si-based brazing filter material foils 29 disposed between the other surface 11b of the ceramic substrate 11 and the buffer layer 22 and between the buffer layer 22 and the heat sink 43 are melted, and the ceramic substrate 11 and the heat sink 43 are joined together through the buffer layer 22.

In the joint portion between the ceramic substrate 11 and the heat sink 43 obtained as described above, the heat resistance is significantly enhanced compared with, for example, joining by soldering method, and it is also possible to prevent the previously-formed resistive element 12 from causing thermal deterioration, since a high temperature of 800° C. or higher is not required during joining.

Figure 6D:
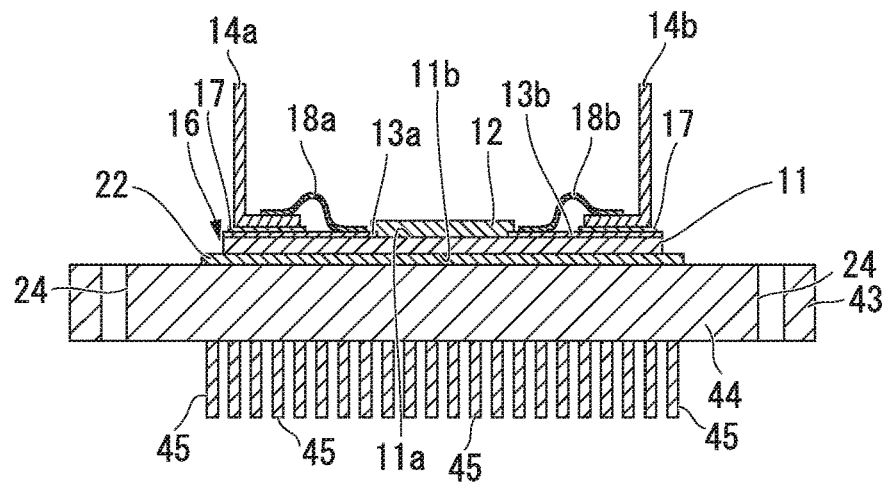
FIG. 6D is a sectional view of the method for manufacturing a resistor according to the second embodiment (metal member-joining step).

Next, as shown in FIG. 6D, the metal terminals 14a and 14b are temporarily secured (positioned and fixed) to the metal electrodes 13a and 13b respectively using the adhesive layers 17. As the metal terminals 14a and 14b, for example, any Cu plates which have a thickness of approximately 0.3 mm and have a section that is curved in a substantially L shape may be used. In addition, the first end sides of the metal members 18a and 18b made of, for example, Al wires or Al tape are brought into contact with the metal electrodes 13a and 13b, and the second end sides of the metal members 18a and 18b are brought into contact with the metal terminals 14a and 14b, respectively. In addition, the contact portions therebetween are pressed (pressurized) under the application of ultrasonic waves, whereby the contact portions are ultrasonic-joined (metal member-joining step: S14). Therefore, the metal electrodes 13a and 13b and the metal terminals 14a and 14b are electrically connected to each other respective using the metal members 18a and 18b.

Figure 7A:
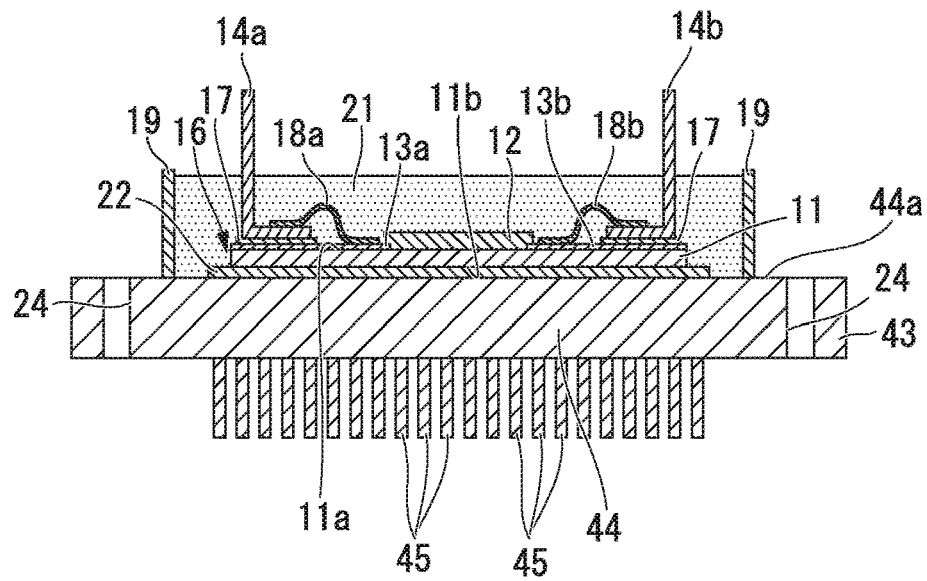
FIG. 7A is a sectional view of the method for manufacturing a resistor according to the second embodiment (scaling resin-forming step).
Figure 8:
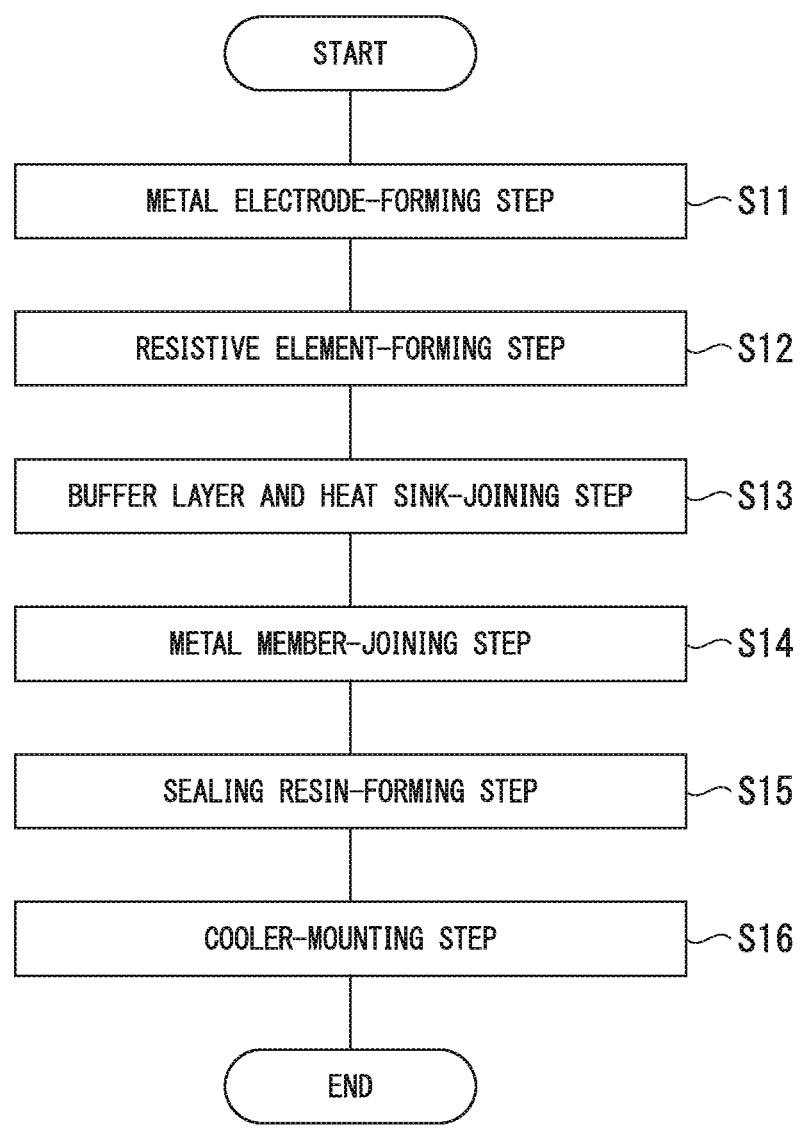
FIG. 8 is a flowchart of the method for manufacturing a resistor according to the second embodiment.

Next, as shown in FIG. 7A, the framework 19 is disposed on the surface 11a of the ceramic substrate 11 so as to surround the periphery of the chip resistive element 16. In addition, the softened insulating resin is loaded into the inside of the framework 19, thereby forming the sealing resin 21 that partially seals the chip resistive element 16 and the metal terminals 14a and 14b (sealing resin-forming step: S15).

Figure 7B:
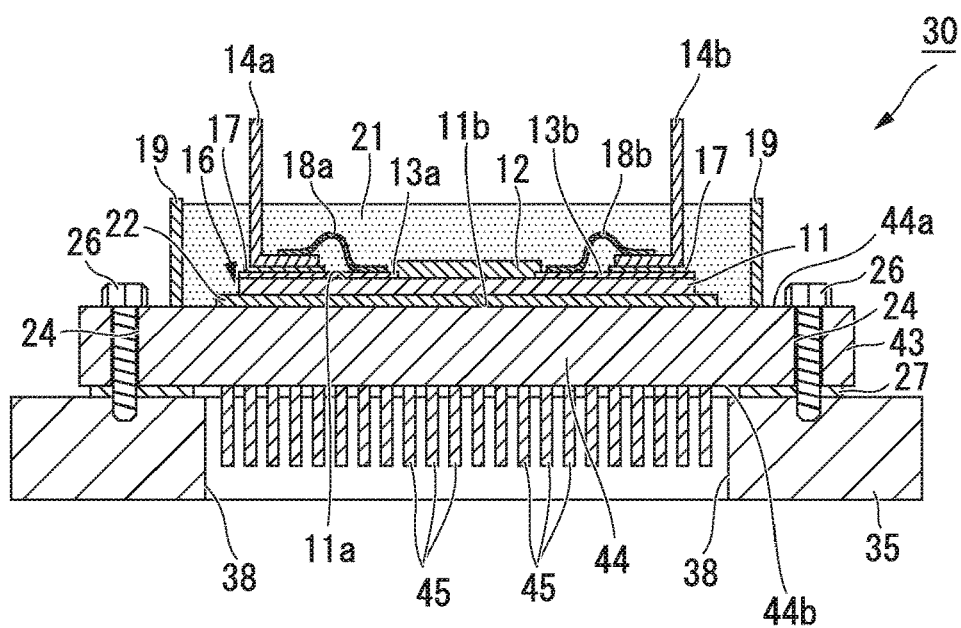
FIG. 7B is a sectional view of the method for manufacturing a resistor according to the second embodiment (cooler-mounting step).

Next, as shown in FIG. 7B, the grease layer 27 made of heat-resistant grease is formed on the peripheries of the opening surfaces of the screw holes 24 and 24, on which the fins 45 are not formed, in the lower surface of the heat sink 43. In addition, the cooler 35 is mounted on the heat sink 43 using the screws 26 and 26 (cooler-mounting step: S16). At this time, the cooler is mounted so that the fins 45 are inserted into the inside of the opening portion 38 formed in the cooler 35 and the fins 45 are exposed outside through the opening portion 38. By methods of the above-described steps, the resistor 30 according to the second embodiment can be manufactured.

According to the resistor 30 in the present embodiment having the above-described constitution and the method for manufacturing the same, since the ceramic substrate 11 and the heat sink 43 are joined together using the Al—Si-based brazing filler material, even when the resistive element 12 generates heat and thus reaches a high temperature, a sufficient joint strength can be maintained, and the heat resistance is excellent compared with a case in which the ceramic substrate and the heat sink are joined together using a soldering material. In addition, since it is possible to decrease the joining temperature compared with a case in which the ceramic substrate and the heat sink are joined together using an Ag—Cu—Ti-based brazing filler material as in the related art, it becomes possible to reliably prevent the thermal deterioration of the resistive element 12 during joining. In addition, it is also possible to reduce a thermal load on the ceramic substrate 11 and the resistive element 12, to simplify the manufacturing steps, and to reduce the manufacturing costs.

In addition, in the present embodiment, since the metal electrodes 13a and 13b and the metal terminals 14a and 14b are electrically connected to each other using long and thin linear members such as Al wires or Al tape, and the metal electrodes 13a and 13b and the metal terminals 14a and 14b are not directly joined together using a conductive layer or the like, there is no concern that poor conduction between the metal electrodes 13a and 13b and the metal terminals 14a and 14b may occur even when the resistive element 12 is subjected to a temperature cycle in which the resistive element generates heat when a current flows and cools when a current does not flow in a repetitive manner.

In addition, when the thickness of the ceramic substrate 11 made of AlN is set in a range of 0.3 mm to 1.0 mm, it is possible to suppress generation of cracks in the ceramic substrate 11 even when the number of times of heat generation in the resistive element 12 is large.

Furthermore, when the thicknesses of the metal terminals 14a and 14b made of Cu are set to 0.1 mm or larger, it is possible to ensure a strength that is sufficient for a terminal and to let a relatively large current flow. In addition, when the thicknesses of the metal terminals 14a and 14b are set to 0.3 mm or smaller, it is possible to suppress generation of cracks in the ceramic substrate 11 even when the number of times of heat generation in the resistive element 12 is large.

In addition, when an insulating resin having a thermal expansion coefficient (linear expansion coefficient) in a range of 8 ppm/° C. to 20 ppm/° C. is used as the sealing resin 21, it is possible to suppress a volume change caused by the thermal expansion of the sealing resin 21 due to the heat generation from the resistive element 12. at a minimum level. With the above-described constitution, it is possible to prevent the occurrence of a disadvantage such as poor conduction caused by the damage of the joint portion due to an excess stress applied to the chip resistive element 16 or the metal terminal 14a or 14b which is covered with the sealing resin 21.

In addition, when the heat sink 43 includes the fins 45, 45, . . . , it is possible to significantly increase the specific surface compared with the heat sink 43 described in the first embodiment. Therefore, it becomes possible to efficiently dissipate heat transferred due to heat generation in the chip resistive element 16 outside through the multiple fins 45, and the cooling function further enhances.

Hitherto, the embodiments of the present invention have been described, but the present invention is not limited thereto, and can be appropriately modified within the scope of the technical concept of the invention.

Meanwhile, in the second embodiment, the buffer layer 22 is formed between the ceramic substrate 11 and the heat sink 43, but the present invention may have a constitution in which the buffer layer 22 is not provided and the ceramic substrate 11 and the heat sink 43 are joined together in direct contact with each other using the Al—Si-based brazing filler material.

In addition, in the first and second embodiments, the metal electrodes 13a and 13b and the metal terminals 14a and 14b are electrically connected to each other through the metal members 18a and 18b made of Al wires or Al tape, but the metal electrodes 13a and 13b and the metal terminals 14a and 14b may be directly electrically joined to each other without having a connection member or the like therebetween. In this case, the metal electrodes 13a and 13b and the metal terminals 14a and 14b may be joined together by process of ultrasonic joining or joining in which a conductive brazing filler material is used.

In addition, the above-descried embodiments, the case in which the resistive element is formed on one surface of the ceramic substrate and then the metal electrodes are formed has been described, but the present invention may have a constitution in which the resistive element is formed after the metal electrodes are formed.

In addition, in the first and second embodiments, the order of forming the sealing resin 21 that partially seals the chip resistive element 16 and the metal terminals 14a and 14b is not limited to those disclosed in the respective embodiments. For example, the chip resistive element and the metal terminals may be sealed using the sealing resin 21 after the cooler is mounted.

In addition, in the second embodiment, the buffer layer 22 and the heat sink 43 are joined together using the Al—Si-based brazing filler material, but it is also possible to use an Al—Cu-based brazing filler material or an Al—Si-Mg-based brazing filler material. Additionally, it is also possible to join the buffer layer and the heat sink using a brazing filler material or the like in which a flux is used after the ceramic substrate and the buffer layer have been joined together in advance using the Al—Si-based brazing filler material.

EXAMPLES

Example 1

Hereinafter, the results of a first confirmation experiment (Example 1) carried out to confirm the effects of the present invention will be described.

Invention Example 1-1

A Ta—Si-based resistive element (10 mm×10 mm×0.5 μm) was formed on one surface of a ceramic substrate made of AlN (15 mm×11 mm×0.635 mmt) using a sputtering method. Furthermore, a metal electrode made of Cu (thickness: 1.6 μm) was formed on a predetermined position on one surface of the ceramic substrate using the sputtering method. In addition, a Cr layer was formed in advance using the sputtering method as a foundation layer for the metal electrode.

Next, a buffer layer made of 4N—Al and a heat sink made of an Al alloy (Al050) (20 mm×13 mm×3 mmt) were laminated on the other surface of the ceramic substrate, the buffer layer was laminated through an Al—Si-based brazing filler material foil, and the heat sink was laminated through another Al—Si-based brazing filler material foil, respectively. In addition, a welding pressure of 5 kgf/cm² was applied in the lamination direction, and the ceramic substrate d the heat sink were held at 645° C. for 30 minutes in a vacuum atmosphere in a vacuum heating furnace, thereby joining the ceramic substrate and the heat sink using an Al—Si-based brazing filler material. A metal terminal made of Cu (thickness: 0.3 μm) was fixed onto the metal electrode using an adhesive, and the metal electrode and the metal terminal were electrically connected to each other using an Al wire. The metal electrode, the metal terminal and the Al wire were joined together respectively by applying ultrasonic waves. Furthermore, the heat sink was fastened to a cooler using a screw, thereby manufacturing a resistor of Invention Example 1.

Invention Example 1-2

Ag paste was printed, dried, and the fired at 850° C. at a predetermined position on one surface of a ceramic substrate made of alumina (15 mm×11 mm×0.38 mmt) using a thick film printing method, thereby forming a thick film metal electrode (thickness: 7 μm). Furthermore, RuO₂ paste for thick film printing was printed, dried, and then fired at 850° C., thereby forming, a resistive element made of RuO₂ (10 mm×10 mm×7 μmt).

Next, a heat sink made of an Al alloy (Al050) (20 mm×13 mm×3 mmt) was laminated on the other surface of the ceramic substrate through an Al—Si-based brazing filler material foil.

In addition, a welding pressure of 5 kgf/cm² was applied in the lamination direction, and the ceramic substrate and the heat sink were held at 645° C. for 30 minutes in a vacuum atmosphere, thereby joining the ceramic substrate and the heat sink using an Al—Si-based brazing filler material. In addition, a metal terminal made of Cu (thickness: 0.3 μm) was fixed onto a metal electrode using an adhesive, and the metal electrode and the metal terminal were electrically connected to each other using an Al wire. The metal electrode, the metal terminal, and the Al wire were joined together respectively by applying ultrasonic waves. Furthermore, the heat sink was fastened to a cooler using a screw, thereby manufacturing a resistor of Invention Example 2.

Conventional Example 1

A Ta—Si-based resistive element (10 mm×10 mm×0.5 μmt) was formed on one surface of a ceramic substrate made of AlN (15 mm×11 mm×0.635 mmt) using a sputtering method. Furthermore, a metal electrode made of Cu (thickness: 1.6 μm) was formed on a predetermined position on one surface of the ceramic substrate using the sputtering method.

Next, a metal terminal (thickness: 0.3 μm) was joined onto the metal electrode using a soldering material (Sn—Ag solder) at 220° C. In addition, a heat sink made of an Al alloy (Al050) was joined to the other surface of the ceramic substrate using a soldering material at 200° C. Meanwhile, the heat sink was joined to the ceramic substrate by soldering method after Ni plating seas carried out on heat sink. Furthermore the heat sink was fastened to a cooler using a screw, thereby manufacturing a resistor of Conventional Example 1.

A heat resistance test described below was carried out on the resistors manufactured as descried above, and the heat resistance was evaluated.

(Heat Resistance Test)

A voltage in a range of 300 V to 500 V was applied o the resistor by connecting the metal terminal in the resistor to a power supply, and the surface temperature of the resistive element was measured using an infrared thermometer. When the surface temperature of the resistive element reached a predetermined temperature, the resistor was held for a predetermined duration at that temperature, and then the power supply was disconnected. In addition, when the surface temperature of the resistive element decreased to 30° C., the above-described voltage application operation was carried out again. This operation was repeated, thereby carrying out a heat resistance test in which the resistive element was caused to generate heat five times. Meanwhile, the above-described predetermined temperature was set to 150° C., 300° C., and 500° C.

(Evaluation of Heat Resistance)

For the resistor that had been subjected to the heat resistance test, a case in which a decrease in the joint strength in the joint portion between the metal electrode and the metal terminal and a decrease in the joint strength in the joint portion between the ceramic substrate and the heat sink (the buffer layer in Invention Example 1-1) were not observed was evaluated to be "A". In addition, a case in which the decrease in the joint strength was 30% or less from the initial value was evaluated to be "B". In addition, case in which the metal terminal and the heat sink (the buffer layer in Invention Example 1-1) peeled from the joint portion was evaluated to be "C".

The evaluation results are shown in Table 1.

The joint strength was measured by holding the resistor that had been subjected to the heat resistance test and horizontally extending the metal terminal. In addition, the joint strength between the ceramic substrate and the heat sink (the buffer layer in Invention Example 1-1) was measured by cutting the ceramic substrate and the heat sink in an appropriate shape, then, holding the heat sink portion, and measuring the shear strength at the interface.

TABLE 1

| | Temperature of heat resistance test | | |
|---|---|---|---|
| | 150° C. | 300° C. | 500° C. |
| Invention Example 1-1 | A | A | A |
| Invention Example 1-2 | A | A | A |
| Conventional Example | A | B | C |

As shown in Table 1, in the resistors of Invention Examples 1 and 2, no decrease in the joint strength was observed in all the heat resistance tests at 150° C., 300° C., and 500° C., and it was confirmed that the heat resistance was favorable.

On the other hand, in the resistor of Conventional Example 1, in the heat resistance test at 300° C., the soldering material was partially melted, and a decrease in the joint strength was observed. In addition, in the heat resistance test at 500° C., the soldering material was melted, and the metal terminal and the heat sink peeled from the joint portion.

Example 2

Next, the results of a second confirmation experiment (Example 2) carried out to confirm the effects of the present invention be described.

The specifications of resistors of Invention Examples 2-1 to 2-21 which were used in the second confirmation experiment are as shown in Table 2.

Meanwhile, as the material for the heat sink and the fins, an Al alloy (Al050) was used. As the material for the buffer layer, Al having a purity shown in Table 2 was used. As the material for the sealing resin, a resin which was obtained by mixing a $SiO_2$ filler with an epoxy resin and had a thermal expansion coefficient shown in Table 2 was used. A sealing resin having a thermal expansion coefficient of 5 ppm/° C. was prepared so as to contain 90% of the $SiO_2$ filler, a sealing resin having a thermal expansion coefficient of 8 ppm/° C. was prepared so as to contain 84% of the $SiO_2$ filler, a sealing resin having a thermal expansion coefficient of 16 ppm/° C. was prepared so as to contain 72% of the $SiO_2$ filler, and a sealing resin having a thermal expansion coefficient of 20 ppm/° C. was prepared so as to contain 69% of the $SiO_2$ filler.

Other constitutions are the same as those in the first and second embodiments.

For the resistors of Invention Examples 2-1 to 2-21 having the above-described constitution, the peeling ratio, the number of times of cracking, and the pressure resistance characteristics were verified.

(1) Peeling ratio: The peeling status and the peeling ratio between the ceramic substrate and the buffer layer after 1,000 times of a temperature cycle (−40° C. to 125° C.) were evaluated. The peeling ratio was obtained using formula (1) below.

(Peeling ratio)=(peeling ratio)/(the area of the ceramic substrate)×100

(1) Meanwhile, for resistors in which the ceramic substrate cracked when the temperature cycle was repeated, the peeling ratio was not evaluated.

(2) The number of times of cracking: Whether or not the ceramic substrate cracked after the repetition of the temperature cycle (−40° C. to 125° C.) was visually observed every 200 times of the temperature cycle. Resistors in which the ceramic substrate did not crack after 1,000 times of the temperature cycle were evaluated to be "no crack".

(3) Pressure resistance characteristics: Resistors in which the dielectric strength voltage between the heat sink and the metal electrode was 1.2 kV/mm or higher were evaluated to be "A", resistors in which the dielectric strength voltage were higher than 0.9 kV/min and lower than 1.2 kV/mm was evaluated to be "B", and resistors in which the dielectric strength voltage was 0.9 kV/mm or lower were evaluated to be "C".

The specifications of the above-described resistors of Invention Examples 2-1 to 2-21 and the results of the evaluation items after the temperature cycle are summarized in Table 2.

Meanwhile, the degrees of curving of the opposite surfaces in heat sinks (Al members), not shown in Table 2, are respectively 81 μm/50 mm for Invention Example 2-1, 80 μm/50 mm for Invention Example 2-2, 85 μm/50 mm for Invention Example 2-3, 81 μm/50 mm for Invention Example 2-4, 82 μm/50 mm for Invention Example 2-5, 80 μm/50 mm for Invention Example 2-6, 92 μm/50 mm for Invention Example 2-7, 57 μm/50 mm for Invention Example 2-8, 98 μm/50 mm for Invention Example 2-9, 48 μm/50 mm for Invention Example 2-10, 250 μm/50 mm for Invention Example 2-11, 33 μm/50 mm for Invention Example 2-12, 520 μm/50 mm for Invention Example 2-13, 30 μm/50 mm for Invention Example 2-14, 71 μm/50 mm for Invention Example 2-15, 88 μm/50 mm for Invention Example 2-16, 55 μm/50 mm for Invention Example 2-17, 98 μm/50 mm for Invention Example 2-18, 77 μm/50 mm for Invention Example 2-19, 68 μm/50 mm for Invention Example 2-20, and 70 μm/50 mm for Invention Example 2-21.

According to Table 2, it was found the results that, regarding the material for the ceramic substrate, alumina is preferably used.

In addition, it was confirmed that the thickness of the ceramic substrate is preferably formed so as to fall into range of 0.3 mm to 1.0 mm.

In addition it was confirmed that the thickness of the heat sink is preferably formed so as to fall into range of 2 mm to 10 mm.

In addition, it was confirmed that the thickness of the buffer layer is preferably formed so as to fall into range of 0.4 mm to 2.5 mm.

In addition, it was confirmed that the purity of Al constituting the buffer layer preferably set to 99.98% or higher.

In addition, it was confirmed that, as the sealing resin, a resin having thermal expansion coefficient in a range of 8 ppm/° C. to 20 ppm/° C. is preferably used.

REFERENCE SIGNS LIST

10, 30 RESISTOR
11 CERAMIC SUBSTRATE

TABLE 2

| | Specifications of evaluation samples | | | | | Evaluation | | |
|---|---|---|---|---|---|---|---|---|
| | Material of substrate | Thickness of substrate | Thickness of heat sink | Thickness of buffer layer | Purity of Al in buffer layer | Thermal expansion coefficient of sealing resin | Peeling ratio | Number of times of cracking | Pressure resistance characteristics |
| Invention Example 2-1 | AlN | 0.635 mm | 3 mm | 0.6 mm | 99.99% | 8 ppm/° C. | 18% | No crack | A |
| Invention Example 2-2 | AlN | 0.635 mm | 3 mm | 0.6 mm | 99.99% | 16 ppm/° C. | 19% | No crack | A |
| Invention Example 2-3 | AlN | 0.635 mm | 3 mm | 0.6 mm | 99.99% | 5 ppm/° C. | 18% | No crack | B |
| Invention Example 2-4 | AlN | 0.635 mm | 3 mm | 0.6 mm | 99.99% | 20 ppm/° C. | 33% | No crack | A |
| Invention Example 2-5 | AlN | 0.635 mm | 3 mm | 0.6 mm | 99.98% | 16 ppm/° C. | 24% | No crack | A |
| Invention Example 2-6 | AlN | 0.635 mm | 3 mm | 0.6 mm | 99.9% | 16 ppm/° C. | — | 600 times | A |
| Invention Example 2-7 | AlN | 0.635 mm | 3 mm | 0.4 mm | 99.99% | 16 ppm/° C. | 23% | No crack | A |
| Invention Example 2-8 | AlN | 0.635 mm | 3 mm | 2.5 mm | 99.99% | 16 ppm/° C. | 27% | No crack | A |
| Invention Example 2-9 | AlN | 0.635 mm | 3 mm | 0.2 mm | 99.99% | 16 ppm/° C. | 32% | No crack | A |
| Invention Example 2-10 | AlN | 0.635 mm | 3 mm | 3.0 mm | 99.99% | 16 ppm/° C. | — | 800 times | A |
| Invention Example 2-11 | AlN | 0.635 mm | 2 mm | 0.6 mm | 99.99% | 16 ppm/° C. | 18% | No crack | A |
| Invention Example 2-12 | AlN | 0.635 mm | 10 mm | 0.6 mm | 99.99% | 16 ppm/° C. | 22% | No crack | A |
| Invention Example 2-13 | AlN | 0.635 mm | 1 mm | 0.6 mm | 99.99% | 16 ppm/° C. | — | 200 times | A |
| Invention Example 2-14 | AlN | 0.635 mm | 15 mm | 0.6 mm | 99.99% | 16 ppm/° C. | — | 800 times | A |
| Invention Example 2-15 | AlN | 0.3 mm | 3 mm | 0.6 mm | 99.99% | 16 ppm/° C. | 16% | No crack | A |
| Invention Example 2-16 | AlN | 1.0 mm | 3 mm | 0.6 mm | 99.99% | 16 ppm/° C. | 25% | No crack | A |
| Invention Example 2-17 | AlN | 0.2 mm | 3 mm | 0.6 mm | 99.99% | 16 ppm/° C. | — | 200 times | A |
| Invention Example 2-18 | AlN | 1.5 mm | 3 mm | 0.6 mm | 99.99% | 16 ppm/° C. | — | 800 times | A |
| Invention Example 2-19 | AlN | 0.38 mm | 3 mm | 0.6 mm | 99.99% | 16 ppm/° C. | 17% | No crack | A |
| Invention Example 2-20 | Al$_2$O$_3$ | 0.5 mm | 3 mm | 0.6 mm | 99.99% | 16 ppm/° C. | 12% | No crack | A |
| Invention Example 2-21 | Si$_3$N$_4$ | 0.32 mm | 3 mm | 0.6 mm | 99.99% | 16 ppm/° C. | 18% | No crack | A |

"—" in the peeling ratio column indicates that the peeling ratio cannot be measured due to the occurrence of ceramic cracking.

12 RESISTIVE ELEMENT
13a, 13b METAL ELECTRODE
14a, 14b METAL TERMINAL
18a, 18b METAL MEMBER
22 BUFFER LAYER
23, 43 HEAT SINK (HEAT-DISSIPATING MEMBER)
45 FIN

The invention claimed is:

1. A resistor comprising:
a chip resistive element formed on one surface of a ceramic substrate, wherein the chip resistive element includes a resistive element, a first metal electrode, and a second metal electrode;
a first metal terminal and a second metal terminal electrically and respectively connected to the first metal electrode and the second metal electrode; and
an Al member formed on the other surface of the ceramic substrate,
wherein the ceramic substrate and the Al member are joined together using an Al—Si-based brazing filler material,
one surface of the resistive element is in contact with the ceramic substrate,
the first metal electrode and the second metal electrode are formed on other surface of the resistive element,
the first metal electrode and the first metal terminal are respectively joined to a first end and a second end of a first metal member, thereby being electrically connected to each other,
the second metal electrode and the second metal terminal are respectively joined to a first end and a second end of a second metal member, thereby being electrically connected to each other, and
the first metal member and the second metal member have a melting point of 450° C. or higher.

2. The resistor according to claim 1, wherein the first metal member and the second metal member are an Al wire or Al tape.

3. The resistor according to claim 1,
wherein the Al member is a laminate of a buffer layer made of Al having a purity of 99.98% or higher and a heat sink, and the buffer layer and the other surface of the ceramic substrate are joined together using an Al—Si-based brazing filler material.

4. The resistor according to claim 3, wherein a thickness of the buffer layer is in a range of 0.4 mm to 2.5 mm.

5. The resistor according to claim 3,
wherein a thickness of the ceramic substrate is in a range of 0.3 mm to 1.0 mm, and a thickness of the heat sink is in a range of 2.0 mm to 10.0 mm.

6. The resistor according to claim 1,
wherein the chip resistive element, the first metal terminal, and the second metal terminal are partially covered with an insulating sealing resin, and the sealing resin is a resin having a thermal expansion coefficient in a range of 8 ppm/° C. to 20 ppm/° C.

7. The resistor according to claim 6,
wherein the sealing resin includes 72% to 84% of the $SiO_2$ filler and 16% to 28% of the epoxy resin.

8. The resistor according to claim 1,
wherein the Al member forms a curved surface on a opposite surface which is located opposite to a joint surface between the ceramic substrate and the Al member, the curved surface curving in a direction opposite to the ceramic substrate, and forming the bottom of a curve in a central region of the opposite surface, and
a degree of curving of the opposite surface is in a range of 30 μm/50 mm to 700μm/50 mm.

9. A method for manufacturing a resistor with which the resistor according to claim 1 is manufactured, the method comprising:
a step of disposing an Al—Si-based brazing filler material between the ceramic substrate and the Al member and pressurizing them in a lamination direction under heating, thereby joining the ceramic substrate and the Al member using the Al—Si-based brazing filler material;
a step of positioning the first metal terminal on a surface of the first metal electrode using an adhesive, and positioning the second metal terminal on a surface of the second metal electrode using an adhesive;
a step of respectively bringing the first metal terminal and the first metal electrode into contact with the first end and the second end of the first metal member and applying ultrasonic waves to them, thereby respectively joining the first metal electrode and the first metal terminal to the first end and the second end of the first metal member, and
a step of respectively bringing the second metal terminal and the second metal electrode into contact with the first end and the second end of the second metal member and applying ultrasonic waves to them, thereby respectively joining the second metal electrode and the second metal terminal to the first end and the second end of the second metal member.

10. The method for manufacturing a resistor according to claim 8 with which the resistor according to claim 6 is manufactured, the method comprising:
a step of disposing a framework so as to surround a periphery of the chip resistive element; and
a step of filling an inside of the framework with the softened sealing resin.

11. The resistor according to claim 1,
wherein the first metal electrode and the first metal terminal are respectively ultrasonic-joined to the first end and the second end of the first metal member,
the second metal electrode and the second metal terminal are respectively ultrasonic-joined to the first end and the second end of the second metal member.

* * * * *